United States Patent
Ha et al.

(10) Patent No.: US 7,126,846 B2
(45) Date of Patent: Oct. 24, 2006

(54) METHOD AND DRIVER FOR PROGRAMMING PHASE CHANGE MEMORY CELL

(75) Inventors: Yong-ho Ha, Hwaseong-si (KR); Beak-hyung Cho, Osan-si (KR); Ji-hye Yi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/401,861

(22) Filed: Apr. 12, 2006

(65) Prior Publication Data

US 2006/0181933 A1    Aug. 17, 2006

Related U.S. Application Data

(62) Division of application No. 10/845,065, filed on May 14, 2004.

(30) Foreign Application Priority Data

Aug. 13, 2003  (KR)  ................ 03-56011

(51) Int. Cl.
   *G11C 11/00*    (2006.01)
(52) U.S. Cl. .................. 365/163; 365/148; 257/2; 257/52
(58) Field of Classification Search ............ 365/163, 365/148; 257/2, 52
See application file for complete search history.

(56) References Cited

U.S. PATENT DOCUMENTS

| 4,225,946 | A  * | 9/1980  | Neale et al. ............. 365/163 |
| 6,075,719 | A    | 6/2000  | Lowrey et al. |
| 6,487,113 | B1   | 11/2002 | Park et al. |
| 6,570,784 | B1   | 5/2003  | Lowrey |
| 6,967,865 | B1 * | 11/2005 | Lee ......................... 365/163 |
| 2003/0123277 | A1 | 7/2003 | Lowrey |
| 2004/0151023 | A1 | 8/2004 | Khouri et al. |
| 2004/0246808 | A1 | 12/2004 | Cho et al. |
| 2005/0041498 | A1 * | 2/2005 | Resta et al. ............ 365/203 |
| 2006/0109704 | A1 * | 5/2006 | Seo et al. ................ 365/148 |

* cited by examiner

*Primary Examiner*—Richard Elms
*Assistant Examiner*—Eric J. Wendler
(74) *Attorney, Agent, or Firm*—Harness, Dickey & Pierce, P.L.C.

(57) ABSTRACT

In the method of programming a phase change memory cell, having a lower resistive state and a higher resistive state, to the lower resistive state, the memory cell is heated to first temperature. Subsequently, the memory cell is heated to second temperature, which is greater than the first temperature.

17 Claims, 8 Drawing Sheets

|    | TR3 | TR4 | TR1 |
|----|-----|-----|-----|
| t1 | OFF | ON  | ON  |
| t2 | OFF | ON  | OFF |

|    | TR3 | TR4 | TR1 |
|----|-----|-----|-----|
| t1 | ON  | OFF | OFF |
| t2 | OFF | ON  | ON  |
| t3 | OFF | ON  | OFF |

METHOD AND DRIVER FOR PROGRAMMING PHASE CHANGE MEMORY CELL

DOMESTIC PRIORITY INFORMATION

This is a divisional of U.S. application Ser. No. 10/845,065 filed May 14, 2004; the contents of which are hereby incorporated by reference in their entirety.

FOREIGN PRIORITY INFORMATION

The present invention claims priority under 35 U.S.C. 119 on Korean Application No. 10-2003-0056011 filed Aug. 13, 2003; the contents of which are hereby incorporated by reference in their entirety.

BACKGROUND OF THE INVENTION

Solid state memory devices that use a structural phase-change material as the data storage mechanism (referred to here simply as 'phase-change memories') offer significant advantages in both cost and performance over conventional charge storage based memories. The phase-change memory is made of an array of constituent cells where each cell has some structural phase change material to store the cell's data. This material may be, for instance, a chalcogenide alloy that exhibits a reversible structural phase change from amorphous to crystalline. A small volume of the chalcogenide alloy is integrated into a circuit that allows the cell to act as a fast switching programmable resistor. This programmable resistor can exhibit greater than 40 times dynamic range of resistivity between a relatively crystalline phase (low resistivity) and a relatively amorphous phase (high resistivity). The data stored in the cell is read by measuring the cell's resistance. The chalcogenide alloy cell is also non-volatile.

Figure 1A:
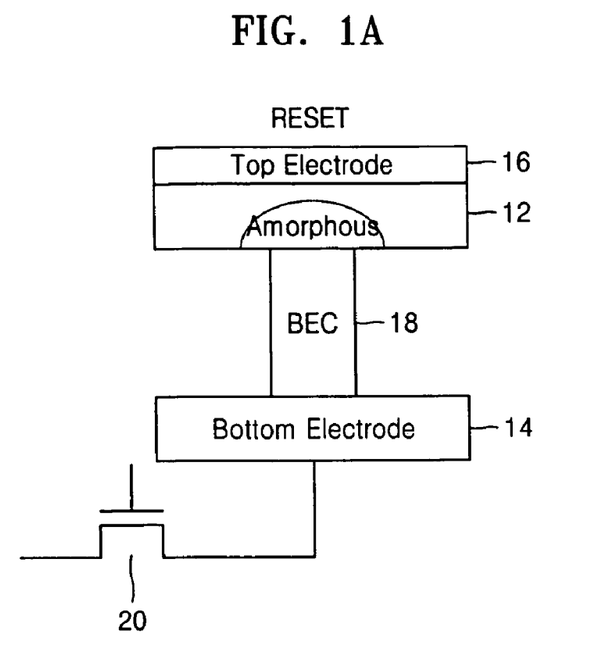
FIG. 1A illustrates a conventional phase change memory cell showing the state of the phase change material when the memory cell is reset (i.e., when in the amorphous state)
Figure 1B:
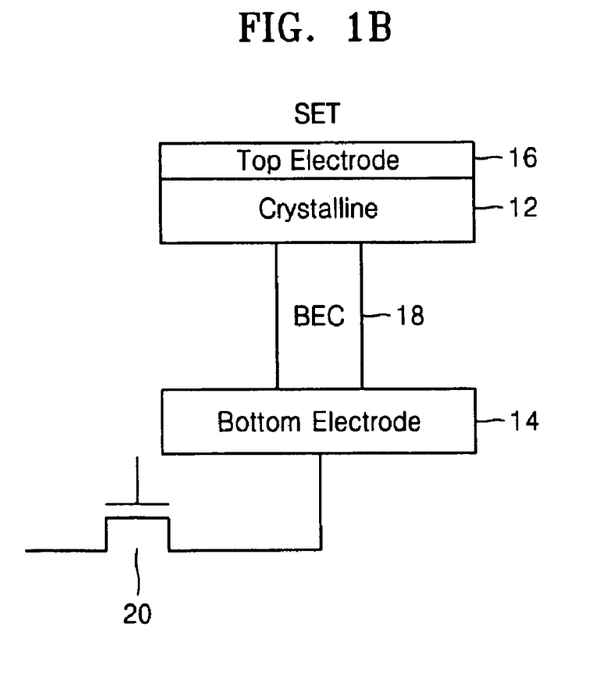
FIG. 1B illustrates the conventional phase change memory cell showing the state of the phase change material when the memory cell is set (i.e., in the crystalline state)

FIGS. 1A and 1B illustrate an example of a phase change memory cell. As shown, the memory cell 10 includes a phase change material 12 disposed between a bottom electrode 14 and a top electrode 16. A bottom electrode contact 18 provides for electrical contact between the bottom electrode 14 and the phase change material 12. A transistor 20 selectively supplies a current to the memory cell 10 to selectively change the state of the phase change material. FIG. 1A illustrates the state of the phase change material 12 when reset (i.e., when in the amorphous state), and FIG. 1B illustrates the state of the phase change material 12 when set (i.e., in the crystalline state). As will be appreciated from FIG. 1A, the phase change material 12 is not completely changed to the amorphous state when reset, and the phase change material 12 may not be complete changed to the crystalline state when set.

A conventional technique for programming a phase-change memory cell is to apply a rectangular pulse of current (having a constant magnitude throughout the pulse) to the cell 10, at a voltage greater than a switching threshold for the phase change material 12, which leaves the cell 10 in the reset state (the phase change material 12 is relatively amorphous and has high resistivity). To change the state to a set state (the phase change material 12 is relatively crystalline and has low resistivity), a rectangular lower current pulse, also at a voltage greater than the switching threshold, is applied to the memory cell 10. The reset pulse has a higher magnitude of current than the set pulse so that the temperature of the phase change material 12 is raised to an amorphizing temperature, before the phase change material 12 is rapidly cooled down or quenched by the very sharp decrease in current at the trailing edge of the reset pulse; thereby leaving the phase change material 12 in the amorphous phase. To change into the crystalline phase, the phase change material 12 can be heated to a temperature, which is lower than the amorphizing temperature, using a rectangular current pulse of smaller magnitude, and then rapidly cooled down again, this time leaving the phase change material 12 in the crystalline (low resistance) phase. Here, the set pulse is considerably longer than the reset pulse.

It is also known to change the phase change material 12 into the crystalline phase by heating the phase change material up to the amorphizing temperature and slowly reducing the applied current to reduce the temperature of the phase change material 12. As the temperature of the phase change material 12 slowly decreases, the phase change material 12 crystallizes. This method of setting the memory cell also requires a significant amount of time.

SUMMARY OF THE INVENTION

In one embodiment of the method of programming a phase change memory cell according to the present invention, the memory cell has a lower resistive state and a higher resistive state. The method includes first heating the memory cell to first temperature, and subsequently, second heating the memory cell to second temperature. In this embodiment, the second temperature is greater than the first temperature.

In one exemplary embodiment, the first temperature is an optimum nucleation temperature and the second temperature is the optimum crystallization temperature.

A further exemplary embodiment includes heating, before the first heating step, the memory cell to a third temperature where the third temperature is greater than the second temperature. For example, in one embodiment, the third temperature is great enough to change the memory cell towards the higher resistive state.

In another method of programming a phase change memory cell according to the present invention, the memory cell is placed in the lower resistive state by first applying a first current to the memory cell and then second applying a second current to the memory cell. In this embodiment, the second current is greater than the first current.

The method may further include placing the memory cell in the higher resistive state by applying a third current to the memory cell where the third current is greater than the second current.

In one embodiment, the step of placing the memory cell in the lower resistive state may apply a fourth current before application of the first current. In this embodiment, the fourth current is the same magnitude as the third current.

According to embodiments of the present invention, the first current may produce a first temperature at the memory cell that is an optimum nucleation temperature, and the second current may produce a second temperature at the memory cell that is the optimum crystallization temperature.

An apparatus for programming a phase change memory cell having a higher resistive state and a lower resistive state, according to one embodiment, includes a current application circuit configured to apply current to the memory cell and a controller controlling the current application circuit. In one embodiment, the controller controls the current application circuit to place the memory cell in the lower resistive state by applying the first current to the memory cell and then applying the second current to the memory cell In another embodiment of the apparatus for programming a phase change memory cell having a lower crystalline state and a higher crystalline state to the higher crystalline state, a heat application circuit is configured to heat the memory cell. This embodiment includes a controller controlling the heat application circuit to place the memory cell in the higher crystalline state by heating the memory cell to the first temperature and then heating the memory cell to the second temperature.

The present invention provides numerous advantages. Included among them is a significantly reduced time to set the memory cell, for example, change the state of the phase change material of the memory cell to a higher crystalline state.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Figure 2:
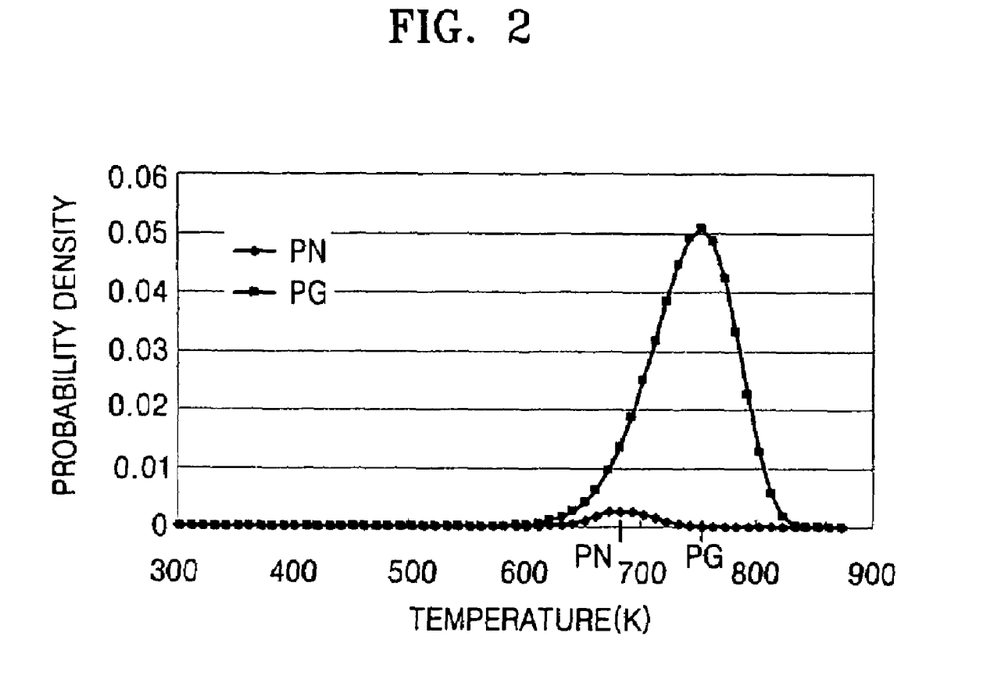
FIG. 2 illustrates a graph of temperature versus probability density for nucleation Pn and crystallization Pg of an example phase change material such as chalcogenide material (Ge, Sb, Te)

FIG. 2 illustrates a graph of temperature versus probability density for nucleation Pn and crystallization Pg of an example phase change material such as chalcogenide material (Ge, Sb, Te). As shown, there exits an optimal temperature PN in the 680–700° K at which nucleation occurs and a different, higher optimal temperature PG in the 700–800° K at which crystallization occurs for a phase change material such as chalcogenide material. In consideration of the above, the inventors discovered that setting a memory cell or crystallizing the phase change material could be achieved much more quickly if optimal nucleation takes place followed by optimal crystallization of the phase change material.

Figure 3A:
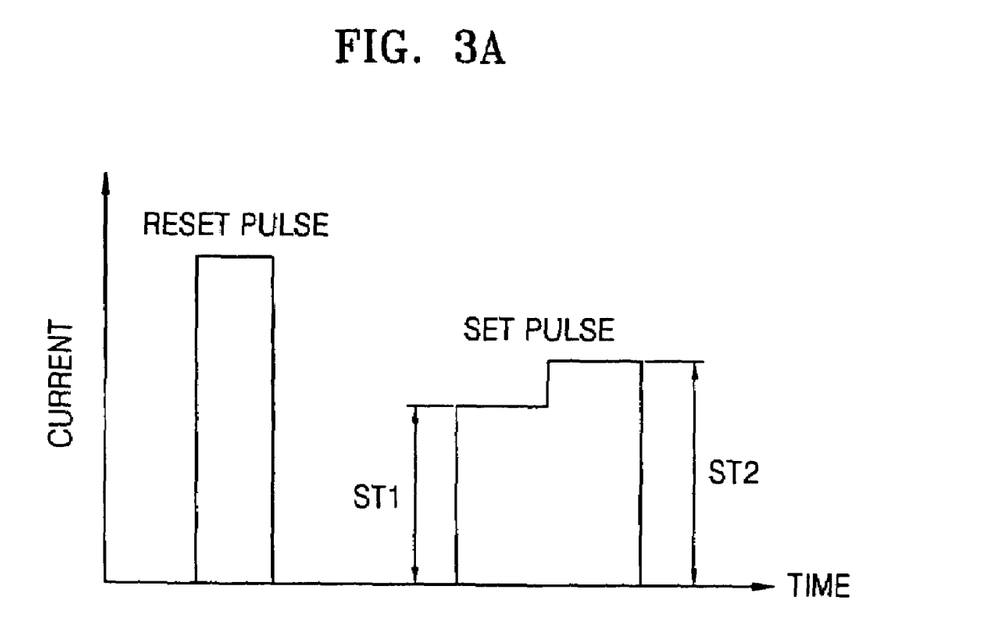
FIGS. 3A and 3B illustrate a first example method for setting and resetting a memory cell according to the present invention.
Figure 3B:
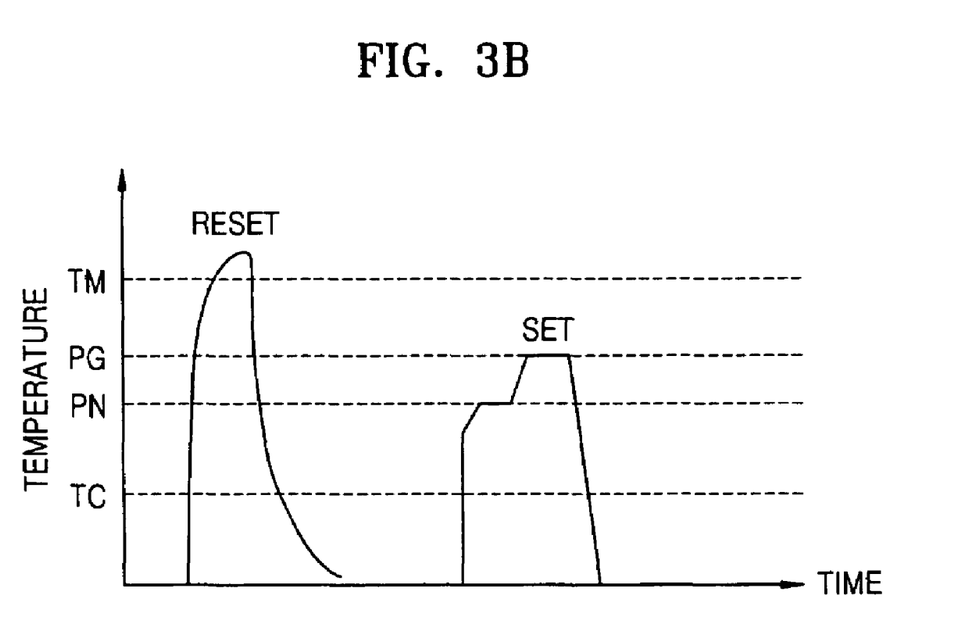

FIGS. 3A and 3B illustrate a first example method for setting and resetting a memory cell according to the present invention. For the purposes of explanation only, this method will be described as applied to the memory cell 10 of FIG. 1. FIG. 3A illustrates the current pulses with respect to time that are applied to a memory cell 10 to reset and set the memory cell 10, and FIG. 3B illustrates the resulting temperature of the phase change material 12 as a result of the applied current pulses.

As shown, a reset pulse as is conventional is applied to change the phase change material 12 to the amorphizing state and reset the memory cell 10. Namely, the current pulse heats the memory cell 10, and in particular, the phase change material 12 to a melting temperature TM of the phase change material 12 and rapidly cools or quenches the phase change material 12 by the very sharp decrease in current at the trailing edge of the reset pulse; thereby leaving the phase change material 12 in the amorphous phase.

With respect to setting the memory cell 10, a set pulse having a first current ST1 for a first time and subsequently a second, higher current ST2 for a second time is applied. As shown, the second time is longer than the first time, and the second and first times are longer than time of the reset pulse. The first current ST1 heats memory cell 10, and in particular, the phase change material 12, to the optimal nucleation temperature PN, and the second current ST2 heats the memory cell 10 to the optimal crystallization temperature PG. The times for applying the first and second currents ST1 and ST2 are a matter of design set based on empirical study of the phase change material 12.

Figure 4:
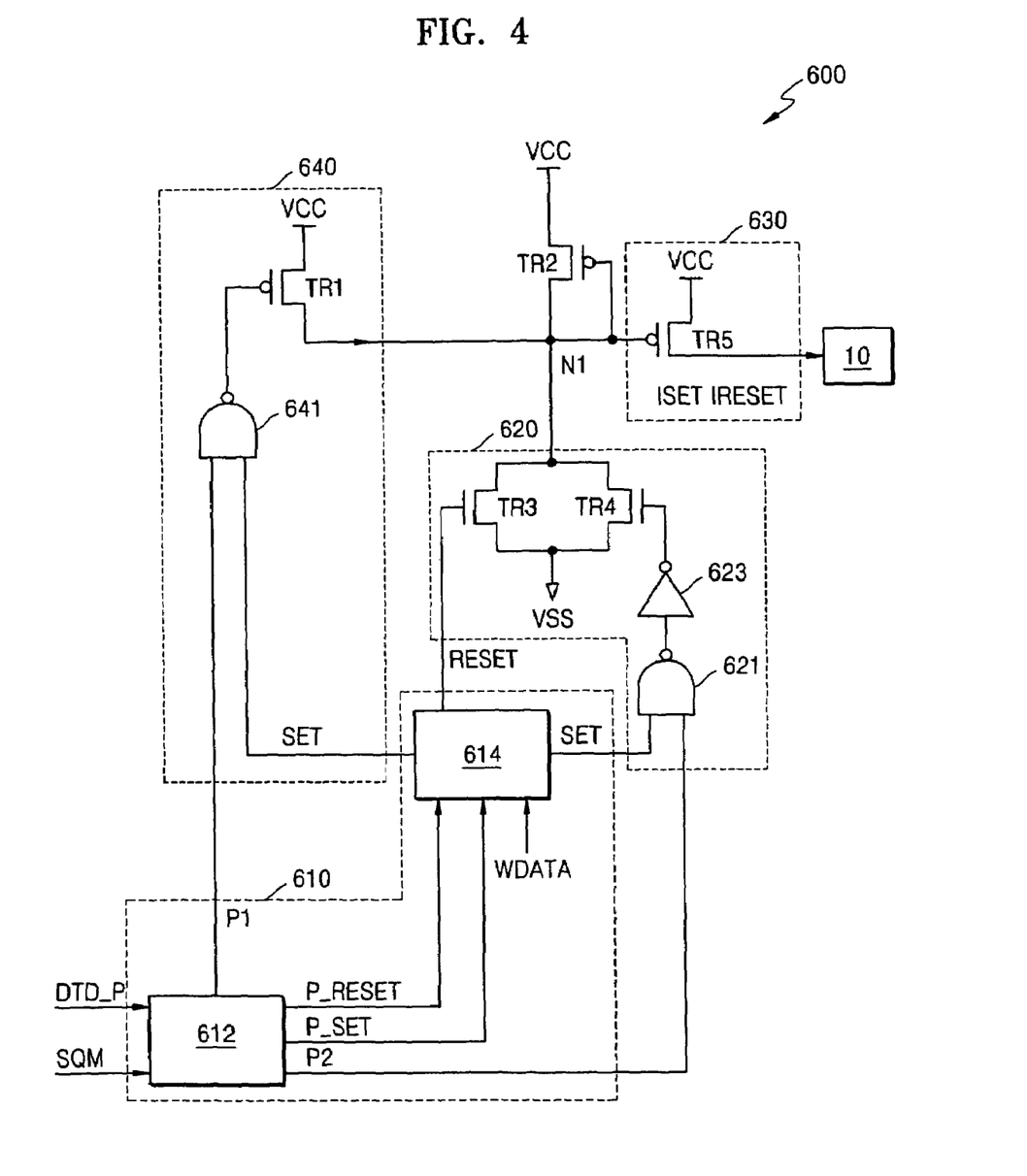
FIG. 4 illustrates an example circuit diagram for a write driver circuit implementing the example method of FIGS. 3A and 3B.

FIG. 4 illustrates an example circuit diagram for a write driver circuit 600 implementing the example method described above with respect to FIGS. 3A and 3B. As shown, a controller 610 controls the operation of a voltage reduction circuit 620 and a current stage control circuit 640, and thus a current generating circuit 630 connected to the voltage reduction circuit 620 and the current stage control circuit 640. The current generating circuit 630 applies current to the memory cell 10. The controller 610 receives an externally applied write data pulse DTD_P (e.g., by asserting certain pins of a memory chip employing the write driver circuit 600) and a mode control signal SQM, and causes the current generating circuit 630 to apply the reset and set pulses in accordance with the external signals.

Specifically, the controller 610 includes a control signal generator 612 that generates a plurality of control signals: a first control signal P1, a second control signal P2, a reset control signal P_RESET and a set control signal P_SET based on the write data pulse DTD_P and the mode control signal SQM. When the mode control signal SQM is logic high, then the control signal generator 612 is set to a first mode. In the first mode, the control signal generator 612 generates the first control signal P1, the second control signal P2, the reset control signal P_RESET and the set control signal P_SET such that the current pulses according to the embodiment of FIGS. 3A–3B may be generated. When the mode control signal SQM is logic low, then the control signal generator 612 is set to a second mode. In the second mode, the control signal generator 612 generates the first control signal P1, the second control signal P2, the reset control signal P_RESET and the set control signal P_SET such that the current pulses according a conventional method of setting and resetting a memory cell may be generated.

Figure 6:
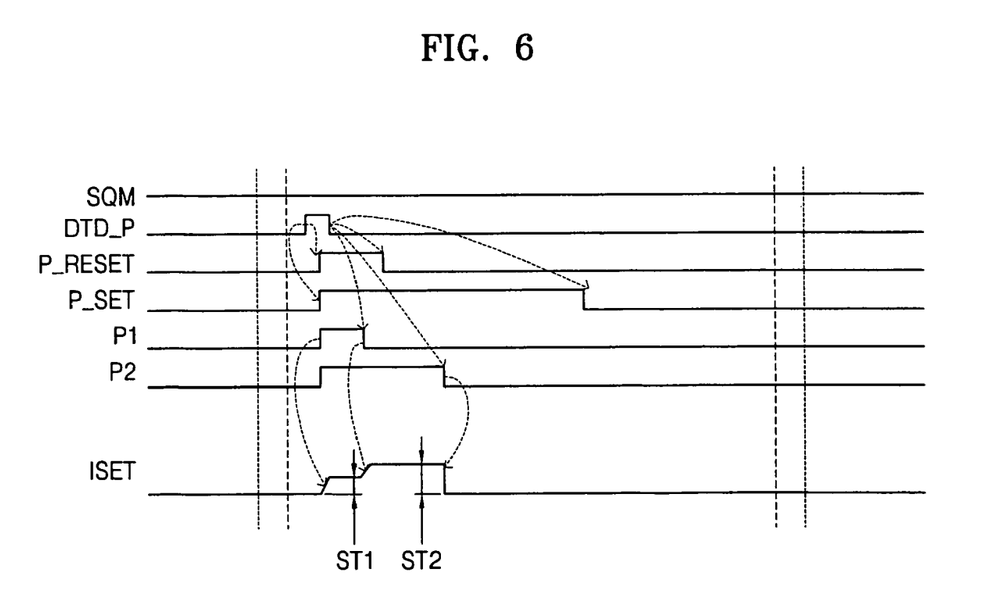
FIG. 6 illustrates the waveforms of signals generated by the write driver circuit of FIG. 4 during a set operation.

When the write data pulse DTD_P of logic high is received during the first mode, this triggers the control signal generator 612 to generate the first control signal P1, the second control signal P2, the reset control signal P_RESET and the set control signal P_SET as shown in FIG. 6, described in detail below.

Figure 5:
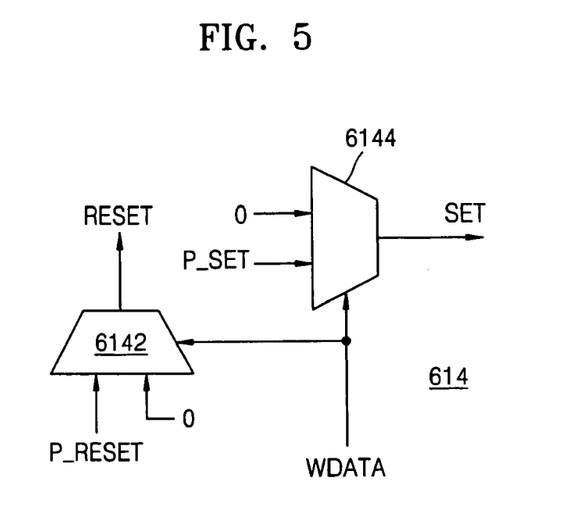
FIG. 5 illustrates an example of the signal selector in the write driver circuit of FIG. 4.

As shown in FIG. 4, a signal selector 614 of the controller 610 controls the output of the reset control signal P_RESET as a reset signal RESET and the set control signal P_SET as a set signal SET based on an externally applied write data signal WDATA. FIG. 5 illustrates an example of the signal selector 614. As shown, a first multiplexer 6142 selectively outputs one of the reset control signal P_RESET and a logic low value based on the state of the write data signal WDATA, and a second multiplexer 6144 selectively outputs one of the set control signal P_SET and a logic low value based on the state of the write data signal WDATA. Namely, when the write data signal WDATA is logic high, the first multiplexer 6142 outputs the reset control signal P_RESET as the reset signal RESET and the second multiplexer 6144 outputs logic low. When the write data signal WDATA is logic low, the first multiplexer 6142 outputs logic low as the reset signal RESET and the second multiplexer 6144 outputs the set control signal P_SET as the set signal SET.

Returning to FIG. 4, the current stage control circuit 640 includes a first NAND gate 641 receiving the first control signal P1 and the set signal SET. The output of the first NAND gate 641 controls the operation of a first PMOS transistor TR1. The first PMOS transistor TR1 is connected between a power supply voltage VCC and a control node N1. Accordingly, the first PMOS transistor TR1 is turned on and supplies the power supply voltage VCC to the control node N1 when the first control signal P1 and the set signal SET are both logic high (i.e., the output of the NAND gate 641 is logic low); otherwise, the first PMOS transistor TR1 is turned off.

A second PMOS transistor TR2 is also connected between the power supply voltage VCC and the control node N1, and has its gate also connected to the control node N1.

The voltage reduction circuit 620 includes first and second NMOS transistors TR3 and TR4 connected in parallel between the control node N1 and ground VSS. The gate of the first NMOS transistor TR3 receives the reset signal RESET. Accordingly, when the reset signal RESET is logic high, the voltage at the control node N1 is pulled down because the first NMOS transistor TR3 turns on. Otherwise, when the reset signal RESET is logic low, the voltage at the control node N1 is substantially unaffected by the first NMOS transistor TR3.

The gate of the second NMOS transistor TR4 receives the output of an inverter 623, which receives the output of a second NAND gate 621. The second NAND gate 621 receives the set signal SET and the second control signal P2. Accordingly, when the second control signal P2 and the set signal SET are logic high: the output of the second NAND gate 621 is logic low, the output of the inverter 623 is logic high, and the second NMOS transistor TR4 is turned on. This operation pulls down the voltage at the control node N1. When the second control signal P2 and the set signal SET are not both logic high: the second NAND gate 621 outputs logic high, the inverter 623 outputs logic low, the second NMOS transistor TR4 is turned off, and the voltage at the control node N1 is substantially unaffected by the second NMOS transistor TR4.

As further shown in FIG. 4, the current generating circuit 630 includes a third PMOS transistor TR5 connected between the power supply voltage VCC and the memory cell 10. The gate of the third PMOS transistor TR5 is controlled by the voltage at the control node N1.

Figure 7:
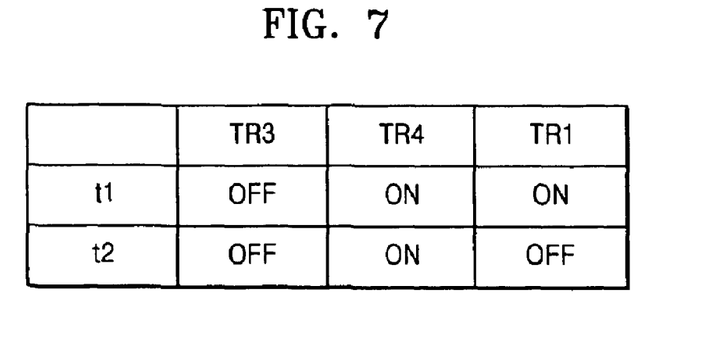
FIG. 7 illustrates the states of transistors in the write driver circuit of FIG. 4 during the set operation.

Next the operation of the write driver circuit 600 illustrated in FIG. 4 will be described in detail with respect to FIG. 4 and FIGS. 6 and 7. FIG. 6 illustrates the waveforms of signals generated by the write driver circuit 600 during a set operation, and FIG. 7 illustrates the states of the first PMOS transistor TR1 and the first and second NMOS transistors TR3 and TR4 during the set operation.

As shown in FIG. 6, when the mode control signal SQM is logic high and a logic high write data pulse DTD_P is received, the control signal generator 612 generates the reset control signal P_RESET, the set control signal P_SET, the first control signal P1 and the second control signal P2 at time t1. As shown, the first control signal P1, the second control signal P2, the reset control signal P-RESET and the set control signal P_SET have fixed amplitudes and durations. The durations and amplitudes of these control signals are a matter of design and established based on empirical study of the phase change material 12. The first control signal P1 has a duration commensurate with a desired duration of the first current ST1 and the second control signal P2 has a duration commensurate with a desired duration of the first and second currents ST1 and ST2 (see FIG. 3A). Furthermore, the set control signal P_SET has a duration at least as long as the second control signal P2, and the reset control signal P-RESET has a duration commensurate with a desired duration of a reset current pulse such as shown in FIG. 3A. The control signal generator 612 behaves in the manner described above regardless of whether a set or reset operation is to take place.

When a logic low write data signal WDATA is received indicating to set the memory cell 10, the signal selector 614 outputs the logic low value as the reset signal RESET, and outputs the set control signal P_SET as the set signal SET. Accordingly, for the duration (t2–t1) of the first control signal P1, the first control signal P1 and the set signal SET are logic high and the first NAND gate 641 turns on the first PMOS transistor TR1. This operation results in the application of the supply voltage VCC to the control node N1. During this same time period, the second control signal P2 and the set signal are logic high and the second NAND gate 621 and inverter 623 turn on the second NMOS transistor TR4. This operation results in the voltage at the control node N1 being pulled down. Also, the logic low reset signal RESET is applied to the first NMOS transistor TR3 such that the first NMOS transistor TR3 is off.

The resulting voltage at the control node N1, turns on the third PMOS transistor TR5 a sufficient amount that the first current ST1 (see FIG. 3A) is applied to the memory cell 10. As shown in FIG. 6, for the time period t1 to t2, which is the duration of the first control signal P1, this first current ST1 is applied.

When the first control signal P1 transitions to logic low at time t2, the set signal SET is still logic high. As such, the first NAND gate 641 turns off the first PMOS transistor TR1. The supply voltage VCC is no longer supplied to the control node N1 by the first PMOS transistor TR1. However, the second control signal P2 and the set signal SET are still logic high, and the second NAND gate 621 and inverter 623 keep the second NMOS transistor TR4 on. As a result, the voltage at the control node N1 is pulled down, and the second PMOS transistor TR2 turns on. Current flows from the supply voltage VCC through the second PMOS and NMOS transistors TR2 and TR4 to ground VSS. Because the second PMOS transistor TR2 has a size greater than the first PMOS transistor TR1, the conductive or current carrying capacity of the second PMOS transistor TR2 is greater than that of the first PMOS transistor TR1. Consequently, the control node N1 is pulled down to a lower voltage than during time t1 to t2. The third PMOS transistor TR5 becomes more conductive, and the second current ST2 (see FIG. 3A) is supplied to the memory cell 10 as shown in FIG. 6.

When the second control signal P2 transitions to logic low, the second NAND gate 621 and the inverter 623 turn off the second NMOS transistor TR4 such that the control node N1 reaches a high voltage state. Namely, the second PMOS transistor TR2 supplies the power supply voltage to the control node N1, which effectively turns off the third PMOS transistor TR5 and ends the supply of current to the memory cell 10 as shown in FIG. 6.

Accordingly, the write driver circuit 600 supplies current as shown in FIG. 3A to the memory cell 10 to set the memory cell 10 by applying heat of the temperatures depicted in FIG. 3B. This sets the memory cell 10 in a significantly reduced time.

Next, the reset operation of the write driver circuit 600 will be described. In this operation, the write data signal WDATA is logic high indicating to reset the memory cell 10. As a result, the signal selector 614 generates a logic low set signal SET and outputs the reset control signal P_RESET as the reset signal RESET.

Because the set signal SET is logic low, the NAND gate 641 turns off the first PMOS transistor TR1. Also, the second NAND gate 621 and the inverter 623 turn off the second NMOS transistor TR4.

The logic high reset signal RESET turns on the first NMOS transistor TR3, which pulls down the voltage at the control node N1. The second PMOS transistor TR2 also turns on and current flows from the supply voltage VCC through the second PMOS and first NMOS transistors TR2 and TR3 to ground VSS. As the control node N1 is pulled down, the third PMOS transistor TR5 becomes more conductive, and a reset current as shown in FIG. 3A is generated.

The size of the first NMOS transistor TR3 is greater than the size of the second NMOS transistor TR4 such that the first NMOS transistor TR3 has a greater capacity to pull down the control node N1 and cause the third PMOS transistor TR5 to supply a reset current that is greater than the second current ST2. As mentioned above, the size of the first PMOS transistor TR1 is less than the size of the second PMOS transistor TR2, and the size of the second PMOS transistor TR2 is less than or equal to the size of the third PMOS transistor TR5.

Figure 8A:
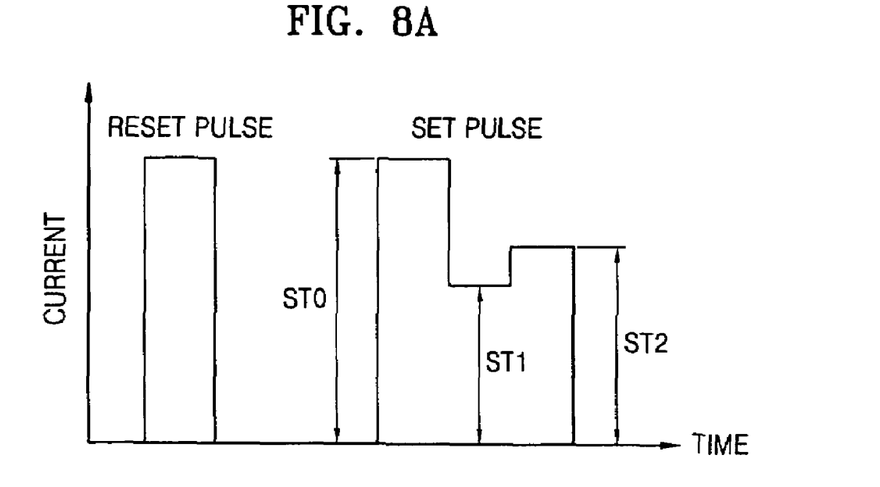
FIGS. 8A and 8B illustrate a second example method for setting and resetting a memory cell according to the present invention.
Figure 8B:
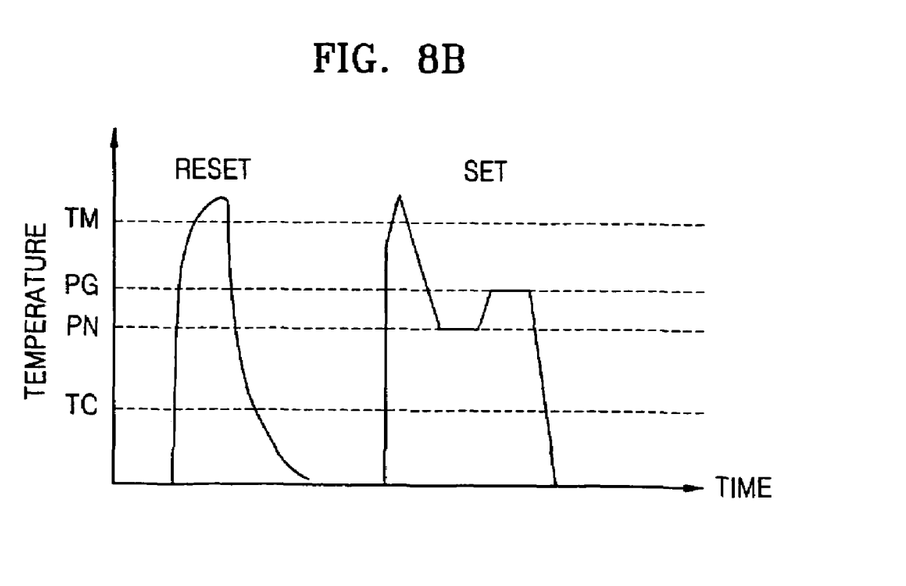

FIGS. 8A and 8B illustrate a second example method for setting and resetting a memory cell according to the present invention. For the purposes of explanation only, this method will be described as applied to the memory cell 10 of FIG. 1. FIG. 8A illustrates the current pulses with respect to time that are applied to a memory cell 10 to reset and set the memory cell 10, and FIG. 8B illustrates the resulting temperature of the phase change material 12 as a result of the applied current pulses.

As shown, a reset pulse as is conventional is applied to change the phase change material 12 to the amorphizing state and reset the memory cell 10. Namely, the current pulse heats the memory cell 10, and in particular, the phase change material 12 to a melting temperature TM of the phase change material 12 and rapidly cools or quenches the phase change material 12 by the very sharp decrease in current at the trailing edge of the reset pulse; thereby leaving the phase change material 12 in the amorphous phase.

With respect to setting the memory cell 10, a set pulse having an initial current ST0 is applied for an initial time followed by application of the currents ST1 and ST2 for first and second times as described above with respect to FIG. 3A. The initial current ST0 may be the same as the reset pulse in magnitude and duration. Accordingly, the initial time is less than the first time, which is less than the second time. The application of the initial current ST0 changes the phase change material 12 to the amorphous state. However, unlike the reset operation, after applying the initial current ST0, the first current ST1 is applied to heat memory cell 10, and in particular, the phase change material 12, at the optimal nucleation temperature PN. Then, the second current ST2 heats the memory cell 10 to the optimal crystallization temperature PG. The times for applying the currents ST0, ST1 and ST2 are a matter of design set based on empirical study of the phase change material 12.

Figure 9:
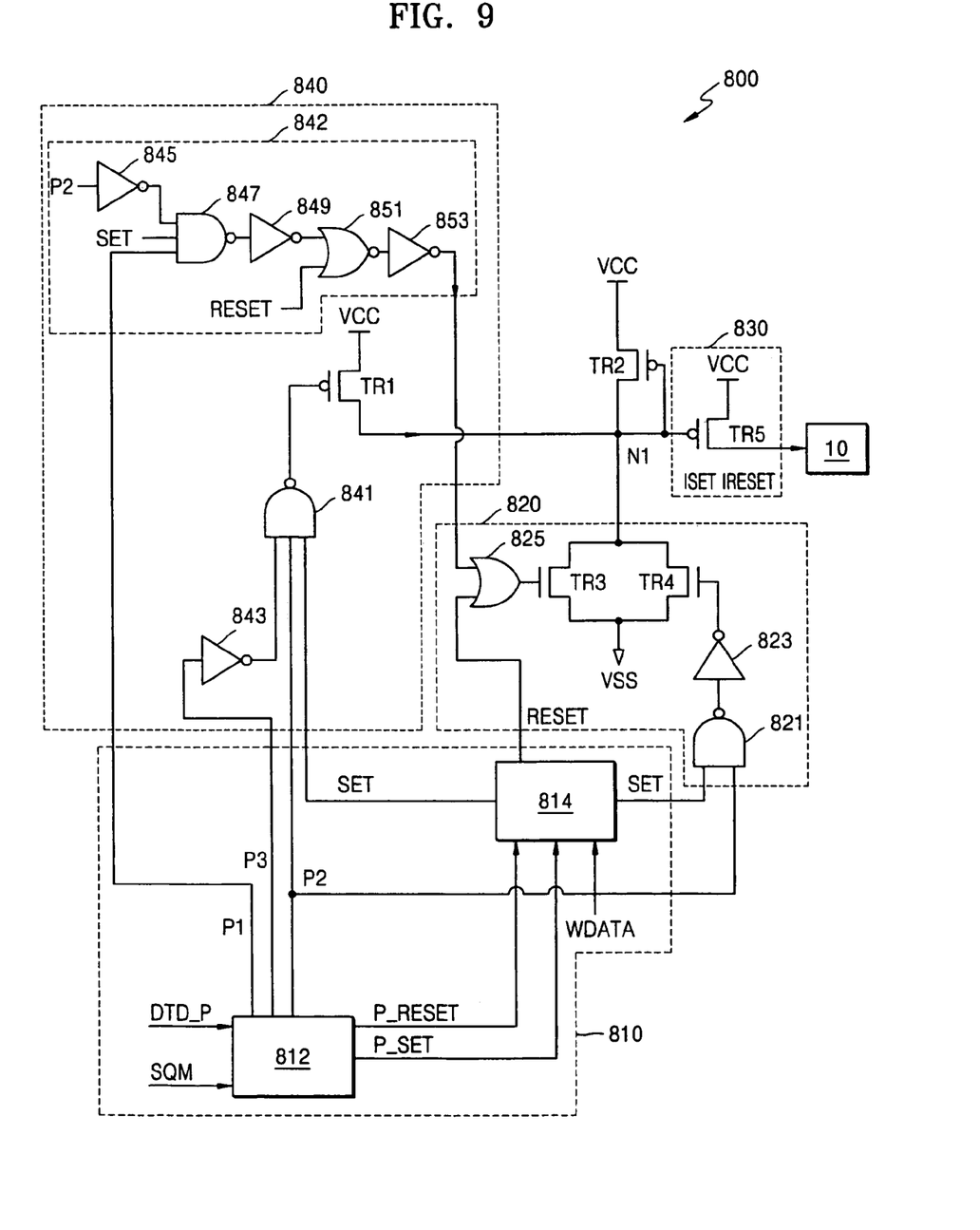
FIG. 9 illustrates an example circuit diagram for a write driver circuit implementing the example method of FIGS. 8A and 8B.

FIG. 9 illustrates an example circuit diagram for a write driver circuit 800 implementing the example method described above with respect to FIGS. 8A and 8B. As shown, a controller 810 controls the operation of a voltage reduction circuit 820 and a current stage control circuit 840, and thus the current generating circuit 830 connected to the voltage reduction circuit 820 and the current stage control circuit 840. The current generating circuit 830 applies current to the memory cell 10. The controller 810 receives an externally applied write data pulse DTD_P (e.g., by asserting certain pins of a memory chip employing the write driver circuit 800) and a mode control signal SQM, and causes the current generating circuit 830 to apply the reset and set pulses in accordance with the external signals.

Specifically, the controller 810 includes a control signal generator 812 that generates a plurality of control signals: a first control signal P1, a second control signal P2, a third control signal P3, a reset control signal P_RESET and a set control signal P_SET based on the write data pulse DTD_P and the mode control signal SQM. When the mode control signal SQM is logic high, then the control signal generator 812 is set to a first mode. In the first mode, the control signal generator 812 generates the first control signal P1, the second control signal P2, the third control signal P3, the reset control signal P_RESET and the set control signal P_SET such that the current pulses according to the embodiment of FIG. 8A may be generated. When the mode control signal SQM is logic low, then the control signal generator 812 is set to a second mode. In the second mode, the control signal generator 812 generates the first control signal P1, the second control signal P2, the third control signal P3, the reset control signal P_RESET and the set control signal P_SET such that the current pulses according a conventional method of setting and resetting a memory cell may be generated.

Figure 10:
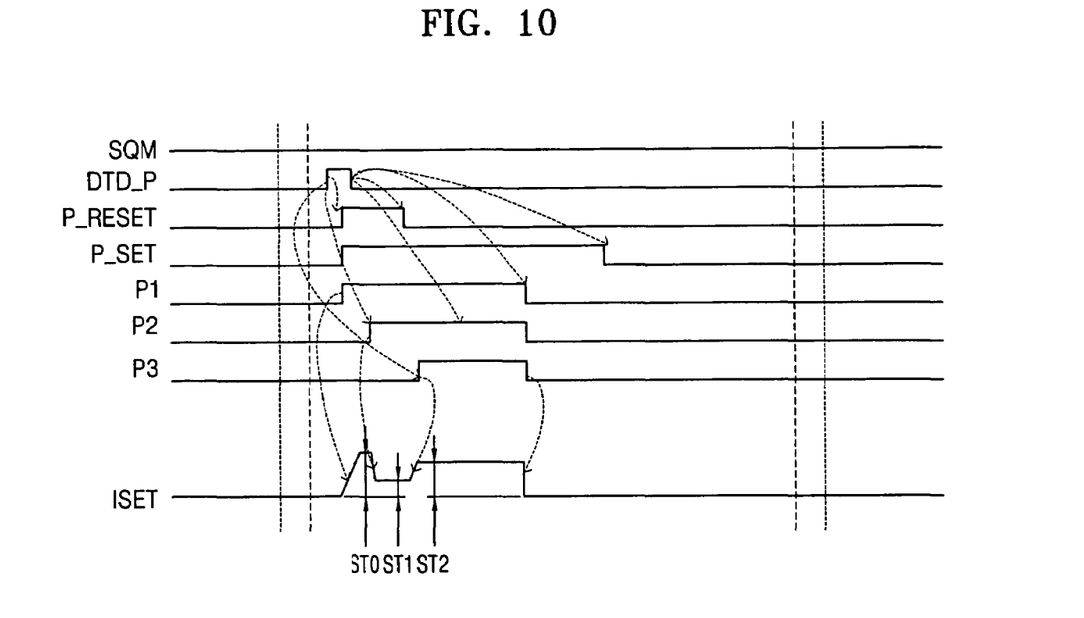
FIG. 10 illustrates the waveforms of signals generated by the write driver circuit of FIG. 9 during a set operation.

When the write data pulse DTD_P of logic high is received during the first mode, this triggers the control signal generator 812 to generate the first control signal P1, the second control signal P2, the third control signals P3, the reset control signal P_RESET and the set control signal P_SET as shown in FIG. 10 described in detail below.

As shown in FIG. 9, a signal selector 814 of the controller 810 controls the output of the reset control signal P_RESET as a reset signal RESET and the set control signal P_SET as a set signal SET based on an externally applied write data signal WDATA. Namely, the signal selector 810 has the same structure and operates in the same manner as the signal selector 614 described above with respect to FIG. 5.

The current stage control circuit 840 includes a first NAND gate 841 receiving the second control signal P2, the set signal SET and an inverted version of the third control signal P3. The third control signal P3 is inverted by a first inverter 843 before being supplied to the first NAND gate 841. The output of the first NAND gate 841 controls the operation of a first PMOS transistor TR1. The first PMOS transistor TR1 is connected between a power supply voltage VCC and a control node N1. Accordingly, the first PMOS transistor TR1 is turned on and supplies the power supply voltage VCC to the control node N1 when the second control signal P2 and the set signal SET are both logic high and the third control signal P3 is logic low (i.e., the output of the NAND gate 641 is logic low); otherwise, the first PMOS transistor TR1 is turned off.

The current stage control circuit 840 also includes a current reduction control signal generating circuit 842. The current reduction control signal generating circuit 842 includes a second inverter 845 inverting the second control signal P2 and a second NAND gate 847 receiving output of the second inverter 845, the first control signal P1 and the set signal SET. A third inverter 849 inverts the output of the second NAND gate 849. An NOR gate 851 performs a NOR operation on the output of the third inverter 849 and the reset signal RESET, and a fourth inverter 853 inverts the output of the NOR gate 851 to produce the current reduction control signal. As will be appreciated, the current reduction control signal has a logic low state only with the output of the third inverter 849 and the reset signal RESET are logic low; otherwise, the current reduction control signal has a logic high state. Furthermore, the output from the third inverter 849 is only logic high when the first control signal P1 is logic high, the second control signal P2 is logic low and the set signal SET is logic high; otherwise, the output of the third inverter 849 is logic low.

A second PMOS transistor TR2 is also connected between the power supply voltage VCC and the control node N1, and has its gate also connected to the control node N1.

The voltage reduction circuit 820 includes first and second NMOS transistors TR3 and TR4 connected in parallel between the control node N1 and ground VSS. The gate of the first NMOS transistor TR3 receives the output of an OR gate 825, which ORs the reset signal RESET and the current reduction control signal. Accordingly, when the reset signal RESET is logic high or the current reduction control signal is logic high, the voltage at the control node N1 is pulled down because the first NMOS transistor TR3 turns on. Otherwise, when the reset signal RESET is logic low and the current reduction control signal is logic low, the voltage at the control node N1 is substantially unaffected by the first NMOS transistor TR3.

The gate of the second NMOS transistor TR4 receives the output of a fifth inverter 823, which receives the output of a third NAND gate 821. The third NAND gate 821 receives the set signal SET and the second control signal P2. Accordingly, when the second control signal P2 and the set signal SET are logic high: the output of the third NAND gate 821 is logic low, the output of the inverter 823 is logic high, and the second NMOS transistor TR4 is turned on. This operation pulls down the voltage at the control node N1. When the second control signal P2 and the set signal SET are not both logic high: the third NAND gate 821 outputs logic high, the inverter 823 outputs logic low, the second NMOS transistor TR4 is turned off, and the voltage at the control node N1 is substantially unaffected by the second NMOS transistor TR4.

As further shown in FIG. 9, the current generating circuit 830 includes a third PMOS transistor TR5 connected between the power supply voltage and the memory cell 10. The gate of the third PMOS transistor TR5 is controlled by the voltage at the control node N1.

Figure 11:
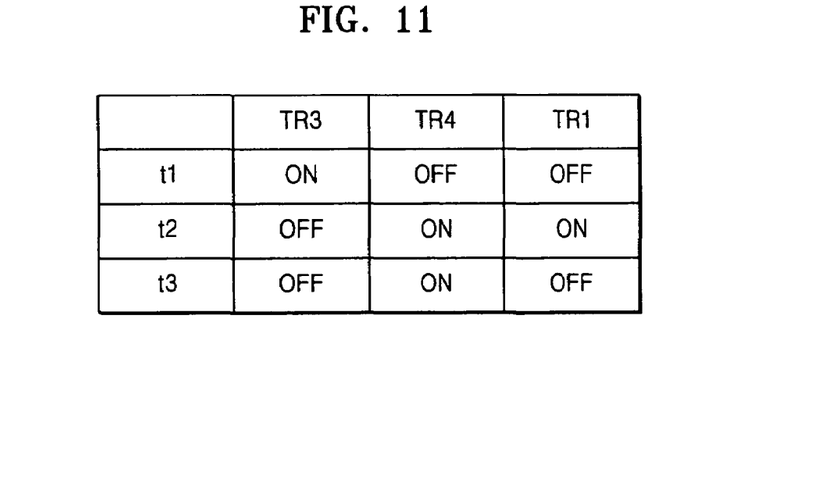
FIG. 11 illustrates the states of transistors in the write driver circuit of FIG. 9 during the set operation.

Next the operation of the write driver circuit 800 illustrated in FIG. 9 will be described in detail with respect to FIG. 9 and FIGS. 10 and 11. FIG. 10 illustrates the waveforms of signals generated by the write driver circuit 800 during a set operation, and FIG. 11 illustrates the states of the first PMOS transistor TR1 and the first and second NMOS transistors TR3 and TR4 during the set operation.

As shown in FIG. 10, when the mode control signal SQM is logic high and the write data pulse DTD_P is received, the control signal generator 812 generates the reset control signal P_RESET, the set control signal P_SET, and the first control signal P1 at time t1. The control signal generator 812 generates a second control signal at a subsequent time t2 and generates the third control signal P3 at a further subsequent time t3. As shown, the first control signal P1, the second control signal P2, the third control signal P3, the reset control signal P-RESET and the set control signal P_SET have fixed amplitudes and durations. The durations and amplitudes of these control signals are a matter of design and established based on empirical study of the phase change material 12. The first control signal P1 has a duration commensurate with a desired duration over which the currents ST0, ST1 and ST2 are applied as shown in FIG. 8A. The second control signal P2 has a duration commensurate with a desired duration over which the currents ST1 and ST2 are applied as shown in FIG. 8A, and the third control signal has a duration commensurate with a desired duration over which the current ST2 is applied as shown in FIG. 8A. As will be described in more detail below, the time t2–t1 between when the first and second control signals P1 and P2 are generated defines the duration that the initial current ST0 is applied; and the duration t3–t2 defines the duration that the first current ST1 is applied.

Furthermore, the set control signal P_SET has a duration at least as long as the first control signal P1, and the reset control signal P_RESET has a duration commensurate with a desired duration of a reset current pulse such as shown in FIG. 8A. The control signal generator 812 behaves in the manner described above regardless of whether a set or reset operation is to take place.

When a logic low write data signal WDATA is received indicating to set the memory cell 10, the signal selector 814 outputs the logic low value as the reset signal RESET, and outputs the set control signal P_SET as the set signal SET. Accordingly, for the duration (t2–t1), only the first control signal P1 and the set signal SET are logic high. As described above, because the second control signal P2 is logic low, the first NAND gate 841 generates a logic high and turns off the first PMOS transistor TR1.

Also during the t1 to t2 time period, the logic low second control signal P2 and logic high set signal SET result in the third NAND gate 821 output a logic high and the inverter 823 outputting a logic low. This turns the second NMOS transistor TR4 off.

During this same time period, the current reduction control signal generator 842 generates a logic high current reduction control signal because, as described above, the first control signal P1 is logic high, the second control signal P2 is logic low, the set signal SET is logic high and the reset signal RESET is logic low. As a result, the OR gate 825 generates a logic high signal and turns on the first NMOS transistor TR3, which pulls down the voltage at the control node N1. The second PMOS transistor TR2 also turns on and current flows from the supply voltage VCC through the second PMOS and first NMOS transistors TR2 and TR3 to ground VSS. As the control node N1 is pulled down, the third PMOS transistor TR5 becomes conductive, and an initial current ST0 as shown in FIG. 8A is generated.

When the second control signal P2 transitions to logic high at time t2, the conditions for generating a logic high current reduction control signal no longer exist, and the current reduction control signal transitions to logic low. The reset signal RESET is logic low as well, and the first NMOS transistor TR3 turns off.

However, as described above, a logic high second control signal P2, logic low third control signal P3 and logic high set signal SET result in the first NAND gate 841 turning on the first PMOS transistor TR1. This operation results in the application of the supply voltage VCC to the control node N1. During this same time period, the second control signal P2 and the set signal are logic high, and the third NAND gate 821 and inverter 823 turn on the second NMOS transistor TR4. This operation results in the voltage at the control node N1 being pulled down.

The resulting voltage at the control node N1, turns on the third PMOS transistor TR5 a sufficient amount that the first current ST1 (see FIG. 8A) is applied to the memory cell 10. As shown in FIG. 10, for the time period t2 to t3, which is the duration between the second control signal P2 being generated and the third control signal P3 being generated, this first current ST1 is applied.

When the third control signal P3 transitions to logic high at time t3, the current reduction control signal remains unchanged such that the first NMOS transistor TR3 remains off. Also, the on state of the second NMOS transistor TR3 is unaffected by the transition of the third control signal P3. However, the transition of the third control signal P3 does result in the first PMOS transistor TR1 being turned off. This operation prevents the supply of the power supply voltage VCC to the control node N1 via the first PMOS transistor TR1. Because the second NMOS transistor TR4 continues to pull down the control node N1, the second PMOS transistor TR2 turns on and a current flows to ground VSS through the second PMOS and first NMOS transistors TR2 and TR4. Because the second PMOS transistor TR2 has a size greater than the first PMOS transistor TR1, the conductive or current carrying capacity of the second PMOS transistor TR2 is greater than that of the first PMOS transistor TR1. Consequently, the control node N1 is pulled down to a lower voltage than during time t2 to t3. The third PMOS transistor TR5 becomes more conductive, and the second current ST2 (see FIG. 8A) is supplied to the memory cell 10 as shown in FIG. 10.

When the first, second and third control signals P1, P2 and P3 transition to logic low, the first PMOS transistor TR1, first NMOS transistor TR3 and the second NMOS transistor TR4 turn off. The second PMOS transistor TR2 supplies the power supply voltage to the control node N1, which effectively turns off the third PMOS transistor TR5 and ends the supply of current to the memory cell 10 as shown in FIG. 10.

Accordingly, the write driver circuit 800 supplies current as shown in FIG. 8A to the memory cell 10 to set the memory cell 10 by applying heat of the temperatures depicted in FIG. 8B. This sets the memory cell 10 in a significantly reduced time.

Next, the reset operation of the write driver circuit 800 will be described. In this operation, the write data signal WDATA is logic high indicating to reset the memory cell 10. As a result, the signal selector 814 generates a logic low set signal SET and outputs the reset control signal P_RESET as the reset signal RESET.

Because the set signal SET is logic low, the NAND gate 841 turns off the first PMOS transistor TR1. Also, the second NAND gate 821 and the inverter 823 turn off the second NMOS transistor TR4.

The logic high reset signal RESET turns on the first NMOS transistor TR3 via the OR gate 825, and this pulls down the voltage at the control node N1. The second PMOS transistor TR2 also turns on and current flows from the supply voltage VCC through the second PMOS and first NMOS transistors TR2 and TR3 to ground VSS. As the control node N1 is pulled down, the third PMOS transistor TR5 becomes more conductive, and a reset current as shown in FIG. 8A is generated.

The size of the first NMOS transistor TR3 is greater than the size of the second NMOS transistor TR4 such that the first NMOS transistor TR3 has a greater capacity to pull down the control node N1 and cause the third PMOS transistor TR5 to supply a reset current or initial current ST3 that is greater than the second current ST2. As mentioned above, the size of the first PMOS transistor TR1 is less than the size of the second PMOS transistor TR2, and the size of the second PMOS transistor TR2 is less than or equal to the size of the third PMOS transistor TR5.

The invention being thus described, it will be obvious that the same may be varied in many ways. Such variations are not to be regarded as a departure from the spirit and scope of the invention, and all such modifications as would be obvious to one skilled in the art are intended to be included within the scope of the present invention.

We claim:

1. A method of programming a phase change memory cell having a lower resistive state and a higher resistive state, comprising:
   placing the memory cell in the lower resistive state by first applying a first current to the memory cell and then second applying a second current to the memory cell, the second current being greater than the first current.

2. The method of claim 1, further comprising:
   placing the memory cell in the higher resistive state by applying a third current to the memory cell, the third current being greater than the second current.

3. The method of claim 2, wherein the placing the memory cell in the lower resistive state applies a fourth current before the first current, the fourth current being a same magnitude as the third current.

4. The method of claim 1, wherein the first current produces a first temperature at the memory cell that is less than a optimum crystallization temperature of the first memory cell.

5. The method of claim 4, wherein the first temperature is an optimum nucleation temperature.

6. The method of claim 5, wherein the second current produces a second temperature at the memory cell that is the optimum crystallization temperature.

7. The method of claim 6, further comprising:
   third applying a third current before the first applying step, the third current being greater than the second current.

8. The method of claim 7, wherein the third current produces a third temperature at the memory cell, and the third temperature is great enough to change the memory cell towards the lower crystalline state.

9. The method of claim 4, wherein the second current produces a second temperature at the memory cell that is the optimum crystallization temperature.

10. The method of claim 4, further comprising:
   third applying a third current before the first applying step, the third current being greater than the second current.

11. The method of claim 10, wherein the third current produces a third temperature at the memory cell, and the third temperature is great enough to change the memory cell towards the lower crystalline state.

12. The method of claim 1, wherein the second current produces a second temperature at the memory cell that is greater than the optimum nucleation temperature.

13. The method of claim 12, wherein the second temperature is an optimum crystallization temperature.

14. The method of claim 13, further comprising:
   third applying a third current before the first applying step, the third current being greater than the second current.

15. The method of claim 14, wherein the third current produces a third temperature at the memory cell and the third temperature is great enough to change the memory cell towards the lower crystalline state.

16. The method of claim 12, further comprising:
   third applying a third current before the first applying step, the third current being greater than the second current.

17. The method of claim 16, wherein the third current produces a third temperature at the memory cell and the third temperature is great enough to change the memory cell towards the lower crystalline state.

* * * * *